US009202889B2

(12) United States Patent
Murthy et al.

(10) Patent No.: US 9,202,889 B2
(45) Date of Patent: Dec. 1, 2015

(54) METHOD FOR IMPROVING TRANSISTOR PERFORMANCE THROUGH REDUCING THE SALICIDE INTERFACE RESISTANCE

(71) Applicant: Intel Corporation, Santa Clara, CA (US)

(72) Inventors: Anand Murthy, Portland, OR (US); Boyan Boyanov, Portland, OR (US); Glenn A Glass, Beaverton, OR (US); Thomas Hoffman, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 13/931,678

(22) Filed: Jun. 28, 2013

(65) Prior Publication Data

US 2013/0302961 A1  Nov. 14, 2013

Related U.S. Application Data

(60) Division of application No. 12/655,341, filed on Dec. 29, 2009, now Pat. No. 8,482,043, which is a continuation of application No. 11/899,881, filed on Sep. 7, 2007, now abandoned, which is a division of (Continued)

(51) Int. Cl.
*H01L 29/43* (2006.01)
*H01L 29/66* (2006.01)
(Continued)

(52) U.S. Cl.
CPC ........ *H01L 29/665* (2013.01); *H01L 21/28518* (2013.01); *H01L 29/165* (2013.01); *H01L 29/6653* (2013.01); *H01L 29/6656* (2013.01); *H01L 29/66628* (2013.01); *H01L 29/66636* (2013.01); *H01L 29/78* (2013.01);

(Continued)

(58) Field of Classification Search
CPC ............ H01L 21/7833; H01L 21/7848; H01L 21/823807; H01L 21/823804
USPC .......................... 438/299–306, 589–595, 664
See application file for complete search history.

(56) References Cited

U.S. PATENT DOCUMENTS 5,156,994 A   10/1992  Moslehi
5,200,352 A    4/1993  Pfiester
(Continued)

OTHER PUBLICATIONS

Hareland, S. et al. "New Structural Approach for Reducing Punchthrough Current in Deep Submicrometer MOSFETS and Extending MOSFET Scaling", XP 000404330 Electronics Letter IEEE Stevanage, GB, vol. 29, No. 21, Oct. 14, 1993, pp. 1894-1896.

(Continued)

*Primary Examiner* — Michael Lebentritt
(74) *Attorney, Agent, or Firm* — Blakely, Sokoloff, Taylor & Zafman LLP

(57) ABSTRACT

An embodiment of the invention reduces the external resistance of a transistor by utilizing a silicon germanium alloy for the source and drain regions and a nickel silicon germanium self-aligned silicide (i.e., salicide) layer to form the contact surface of the source and drain regions. The interface of the silicon germanium and the nickel silicon germanium silicide has a lower specific contact resistivity based on a decreased metal-semiconductor work function between the silicon germanium and the silicide and the increased carrier mobility in silicon germanium versus silicon. The silicon germanium may be doped to further tune its electrical properties. A reduction of the external resistance of a transistor equates to increased transistor performance both in switching speed and power consumption.

6 Claims, 12 Drawing Sheets

Related U.S. Application Data application No. 11/171,097, filed on Jun. 29, 2005, now Pat. No. 7,274,055, which is a division of application No. 10/731,269, filed on Dec. 8, 2003, now Pat. No. 6,949,482.

(51) Int. Cl.
*H01L 21/285* (2006.01)
*H01L 29/165* (2006.01)
*H01L 29/78* (2006.01)
*H01L 21/8238* (2006.01)

(52) U.S. Cl.
CPC ........ *H01L29/7842* (2013.01); *H01L 29/7848* (2013.01); *H01L 21/823807* (2013.01); *H01L 21/823814* (2013.01); *H01L 29/6659* (2013.01); *H01L 29/7833* (2013.01); *Y10S 438/933* (2013.01)

(56) References Cited

U.S. PATENT DOCUMENTS

| | | | |
|---|---|---|---|
| 5,891,766 A | 4/1999 | Yamazaki et al. | |
| 5,908,313 A | 6/1999 | Chau et al. | |
| 6,063,675 A | 5/2000 | Rodder | |
| 6,214,679 B1 | 4/2001 | Murthy et al. | |
| 6,291,861 B1 | 9/2001 | Iwata et al. | |
| 6,342,421 B1 | 1/2002 | Mitani et al. | |
| 6,417,543 B1 | 7/2002 | Yamazaki et al. | |
| 6,440,851 B1 | 8/2002 | Agnello et al. | |
| 6,506,637 B2 | 1/2003 | Maa et al. | |
| 6,518,155 B1 | 2/2003 | Chau et al. | |
| 6,621,131 B2 | 9/2003 | Murthy et al. | |
| 6,653,700 B2 | 11/2003 | Chau et al. | |
| 6,664,143 B2 | 12/2003 | Zhang | |
| 6,765,273 B1 | 7/2004 | Chau et al. | |
| 6,787,864 B2 | 9/2004 | Paton et al. | |
| 6,887,762 B1 | 5/2005 | Murthy et al. | |
| 6,949,482 B2 * | 9/2005 | Murthy et al. | 438/739 |
| 7,195,985 B2 | 3/2007 | Murthy et al. | |
| 7,247,535 B2 | 7/2007 | Jain | |
| 7,429,775 B1 * | 9/2008 | Nayak et al. | 257/369 |
| 7,479,432 B2 | 1/2009 | Murthy et al. | |
| 8,120,065 B2 * | 2/2012 | Datta et al. | 257/192 |
| 8,482,043 B2 * | 7/2013 | Murthy et al. | 257/295 |
| 2002/0011603 A1 | 1/2002 | Yagishita et al. | |
| 2002/0130393 A1 | 9/2002 | Takayangi et al. | |
| 2004/0036126 A1 | 2/2004 | Chau et al. | |
| 2005/0035409 A1 | 2/2005 | Ko et al. | |
| 2006/0131657 A1 * | 6/2006 | Hamaguchi | 257/369 |
| 2007/0238236 A1 | 10/2007 | Cook et al. | |
| 2011/0101418 A1 | 5/2011 | Murthy et al. | |

OTHER PUBLICATIONS

Notice of First Office Action dated Apr. 11, 2008 for Chinese Patent Application No. 200480033557.X corresponding to U.S. Appl. No. 12/655,341 and English Translation thereof.
Notice of Second Office Action dated Dec. 26, 2008 for Chinese Patent Application No. 200480033557.X corresponding to U.S. Appl. No. 12/655,341 and English Translation thereof.
Notice of Preliminary Rejection dated Apr. 29, 2007 for Korean Patent Application No. 2006-7011269 corresponding to U.S. Appl. No. 12/655,341.
Notice of Office Action for Taiwan Patent Application No. 93135874 corresponding to U.S. Appl. No. 12/655,341 and English Translation thereof.
Office Action dated May 6, 2008 for German Patent Application No. 11 2004 002 409.9-33 corresponding to U.S. Appl. No. 12/655,341.
Notice of First Office Action dated Apr. 12, 2011 for Chinese Patent Application No. 200910205003.8 corresponding to U.S. Appl. No. 12/655,341 and English Translation thereof.
PCT/US2004/038986 International Search Report dated Nov. 19, 2004.
PCT/US2004/038986 Written Opinion dated Nov. 19, 2004.
PCT/US2004/038986 Preliminary Report of Patentability dated Nov. 19, 2004.
Office Communication mailed Oct. 12, 2011 for U.S. Appl. No. 12/655,323, filed Dec. 29, 2009.

* cited by examiner

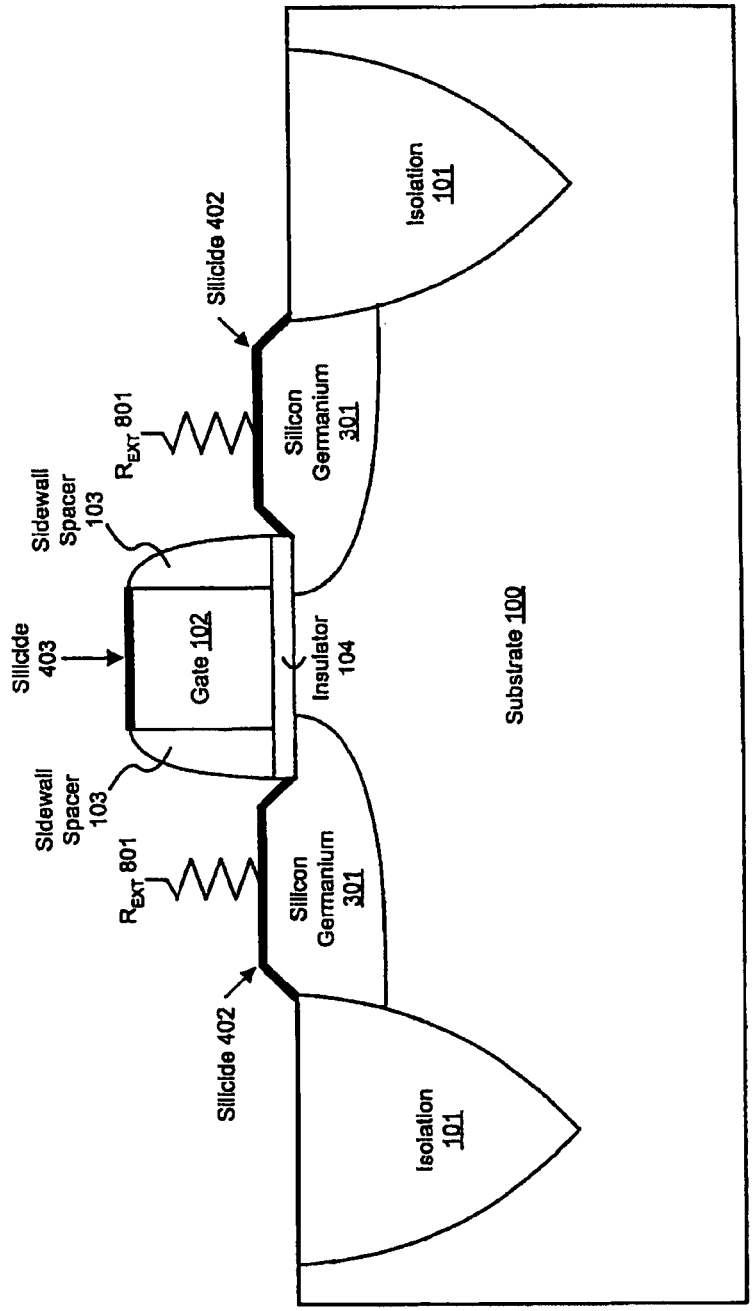

METHOD FOR IMPROVING TRANSISTOR PERFORMANCE THROUGH REDUCING THE SALICIDE INTERFACE RESISTANCE

RELATED CASES

This application is a divisional application of application Ser. No. 12/655,341, filed on Dec. 29, 2009 which is a continuation application of application Ser. No. 11/899,881 filed on Sep. 7, 2007 which is a divisional application of application Ser. No. 11/171,097 filed on Jun. 29, 2005 now U.S. Pat. No. 7,274,055 which is a divisional application of application Ser. No. 10/731,269 filed Dec. 8, 2003 now U.S. Pat. No. 6,949,482.

FIELD

Embodiments of the invention relate to high speed semiconductor transistors, and more specifically to increasing transistor performance by utilizing silicon germanium and improved methods of application thereof.

BACKGROUND

Silicon complementary metal oxide semiconductor ("CMOS") technology is a dominant microelectronic technology. CMOS offers high reliability, high levels of integration, low power dissipation, and is very cost-effective. For lower frequency applications CMOS will most likely remain the dominant technology. However, electron and hole mobility in silicon limits the extent to which CMOS devices can be utilized for higher speed applications such as radars and mobile communication devices that require high transistor switching rates.

One historical solution has been to use semiconductor compounds instead of elemental semiconductors such as Group IV silicon and germanium. These compounds can be binary, tertiary, and quanternary combinations of Group II (Zn and Cd), Group III (B, Al, Ga, and In), Group IV (C, Si, and Ge), Group V (P, As, and Sb) and Group VI (S, Se, and Te) elements. Common III-V semiconductors include Gallium Arsenide (GaAs), Gallium Phosphide (GaP), and Indium Phosphide (InP). Gallium Arsenide, in particular, has widespread use as a source of and sensor to near infrared light given its 1.43 electron volt ("eV") band gap and as the primary semiconductor for high speed electronic devices. Despite the speed improvements over silicon CMOS devices, GaAs is for most applications cost prohibitive. One estimate indicates that per square millimeter in 1995 dollars, silicon CMOS has a $0.01 cost while GaAs epitaxy has a $2.00 cost.

A newer approach, and one that offers the speed benefits of GaAs and improved cost-effectiveness of silicon CMOS, employs silicon germanium (strained or unstrained, usually denoted more precisely by $Si_{1-x}Ge_x$ or simply as SiGe) and/or strained silicon. Germanium has a 4.2% larger lattice constant (e.g., atomic spacing) than silicon. Silicon germanium also has a larger lattice constant, the extent of which depends on the percentage composition of germanium. When silicon is grown on silicon germanium, under proper conditions the silicon lattice stretches to match that of the silicon germanium at the silicon/silicon germanium interface. When silicon germanium is grown on silicon, under proper conditions the silicon germanium lattice gets compressed. For each method, there is critical thickness of the grown layer (be it silicon or silicon germanium) past which the grown layer relaxes as lattice defects propagate.

There are two reasons why strained silicon and silicon germanium offer improved speed characteristics for transistors comprised thereof. Compared to elemental silicon, germanium has a lower electron effective mass and lower hole effective mass (leading to higher electron mobility and higher hole mobility). Silicon germanium compounds benefit from the increased mobilities of the constituent germanium. Further, the induced strain in silicon or silicon germanium (tension and compression respectively) creates an anisotropic structure that alters the conduction and valence bands of the materials. When combined with other semiconductor layers (e.g., heterolayers) with different band gaps, conduction band and valence band discontinuities can be designed to create quantum wells or built-in electric fields to accelerate carriers across the heterolayers.

Silicon germanium deposition can be incorporated into CMOS process flows relatively easily. For example, the only major increase in cost is the addition of a silicon germanium epitaxy step. Given the ease of integration and the band gap engineering possible with silicon germanium (e.g., bulk silicon, bulk silicon germanium, and strained variants of each) the possibility of manufacturing an entire system on one silicon or silicon on insulator ("SOI") substrate is real. Integrated systems could include fiber optic connections, waveguides, optical detectors, CMOS, heterojunction bipolar transistors, and quantum devices all on the same chip.

Simply using strained silicon and/or silicon germanium does not render immediately superior devices. As with all paradigm shifts, incorporating strained silicon and silicon germanium into current semiconductor processing flows creates a new set of problems to solve.

BRIEF DESCRIPTION OF THE DRAWINGS

FIG. 8: illustration of a substrate cross section indicating the external resistance ($R_{ext}$) of the metal oxide semiconductor transistor

DETAILED DESCRIPTION

Figure 1A:
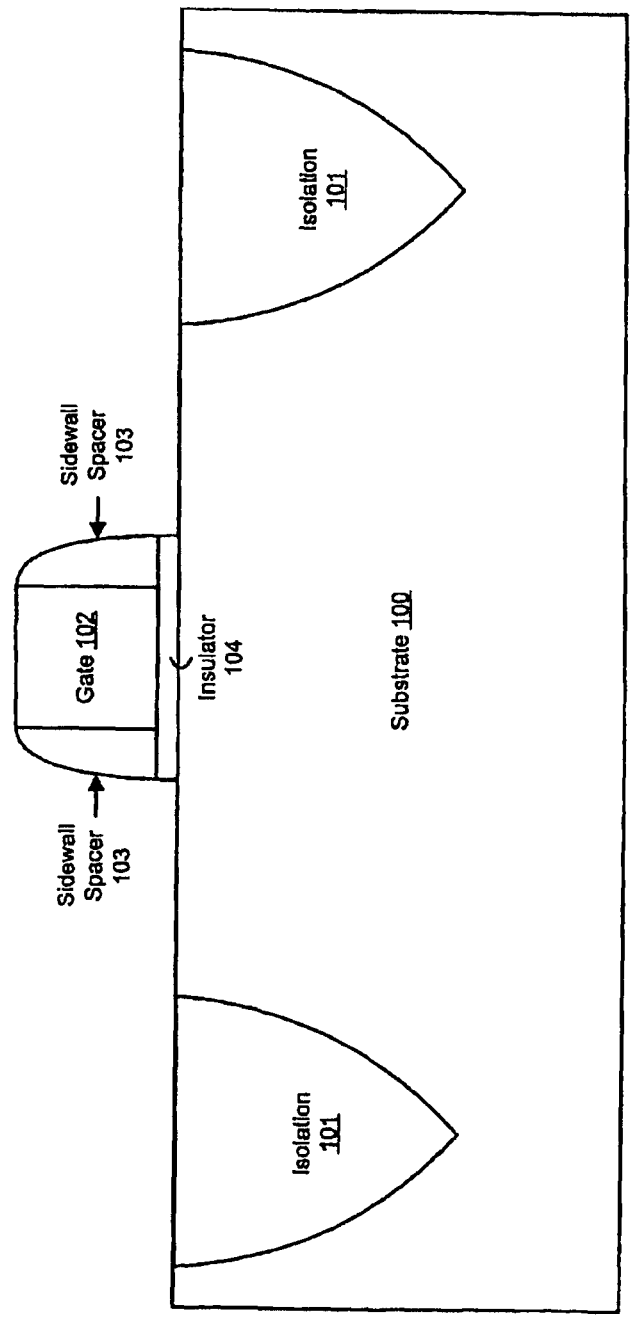
FIG. 1a: illustration of a substrate cross section following the formation of the gate and nitride spacers

Embodiments of a method for improving transistor performance will be described. Reference will now be made in detail to a description of these embodiments as illustrated in the drawings. While the embodiments will be described in connection with these drawings, there is no intent to limit them to drawings disclosed therein. On the contrary, the intent is to cover all alternatives, modifications, and equivalents within the spirit and scope of the described embodiments as defined by the accompanying claims.

An embodiment of the invention reduces the external resistance of a transistor by utilizing a silicon germanium alloy for the source and drain regions and a nickel silicon germanium self-aligned silicide (i.e., salicide) layer to form the contact surface of the source and drain regions. The interface of the silicon germanium and the nickel silicon germanium silicide has a lower specific contact resistivity based on a decreased metal-semiconductor work function between the silicon germanium and the silicide and an increased carrier mobility in silicon germanium versus silicon. The silicon germanium may be doped to further tune its electrical properties. A reduction of the external resistance of a transistor equates to increased transistor performance both in switching speed and power consumption.

The first transistor created in 1947 was germanium. However, given its narrow band gap of 0.67 electron volts (versus 1.11 electron volts for silicon), reverse-biased germanium p-n junctions exhibit large leakage currents. This limited the operating temperature of germanium to below 100° C. In addition, it is difficult to manufacture a passivation layer as required by semiconductor processing techniques. Germanium oxide, for example, is water soluble and dissociates at 80° C. These qualities, coupled with electronics-grade germanium demanding an order of magnitude higher cost versus silicon, have virtually eliminated elemental germanium from modern semiconductor technology.

There are, however, benefits to using germanium versus silicon. For example, at room temperature, germanium has a electron mobility of 3600 cm$^2$/V-s compared to 1350 cm$^2$/V-s for silicon. Even more striking is germanium's hole mobility of 1800 cm$^2$/V-s versus 480 cm$^2$/V-s for silicon. As germanium has an intrinsic carrier concentration of $2.5*10^{13}$ cm-3 and silicon has $1.5*10^{10}$ cm-3 at 300K, given that conductivity is proportional to the product of the sum of the mobilities and the intrinsic carrier concentration, germanium has a significantly higher conductivity. As will be more further described below, the performance of a transistor is related to the external resistance. Given that resistivity is the inverse of conductivity, utilizing a more highly conductive material increases the performance of a transistor. Alloying silicon and germanium provides the ability to tune the material to utilize the benefits of each constituent semiconductor. As will be described with reference to an embodiment of the invention, a semiconductor alloy of silicon and germanium offers promising improvements in certain semiconductor applications.

FIG. 1a illustrates a substrate cross section following various processing steps to begin creation of a metal oxide semiconductor ("MOS") transistor. One skilled in the art will recognize what processing steps have occurred, the explanation of which will be omitted. In an embodiment of the invention, the transistor is a p-type MOS or PMOS. Substrate 100 is silicon. An isolation barrier 101 serves as a channel stop to prevent parasitic effects between closely arrayed transistors in an integrated circuit application. The isolation barrier 101 may be, for example, a shallow trench isolation ("STI") region formed by etching a trench in the substrate 100 and filling the trench with a deposited oxide isolation material. A gate 102 has been formed and patterned atop an insulator 104, the composition of the gate 102 being, for example, polycrystalline silicon. The polycrystalline silicon of gate 102 may be further pre-doped. On each side of the gate 102 there is a sidewall spacer 103 usually formed of silicon nitride. Each sidewall spacer 103 serves as a hard mask for subsequent self-aligned processing steps. One skilled in the art will understand that, for example, the sidewall spacer 103 is a hard mask for high dose implants in a lightly doped drain transistor design or other designs that would benefit from the sidewall spacing as is well known in the art.

Figure 1B:
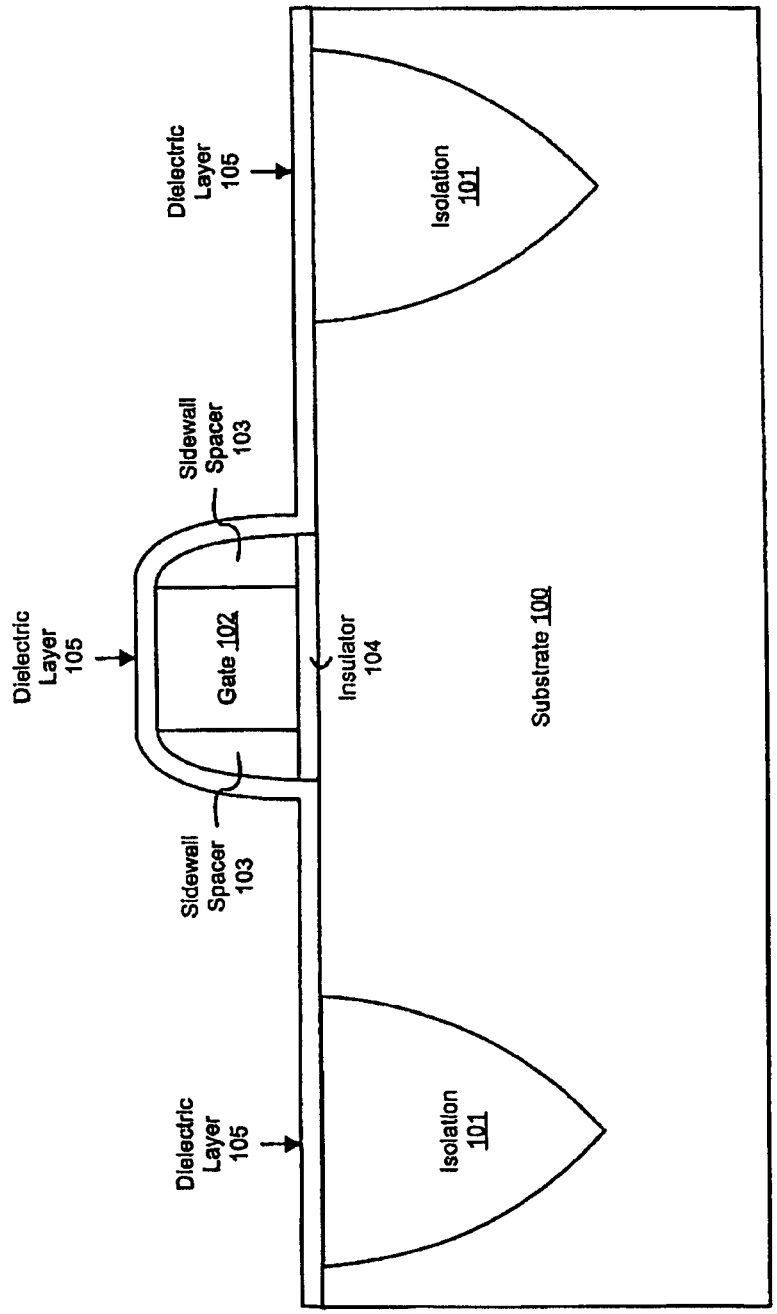
FIG. 1b: illustration of a substrate cross section following the deposition of a dielectric film over the entire substrate surface
Figure 1C:
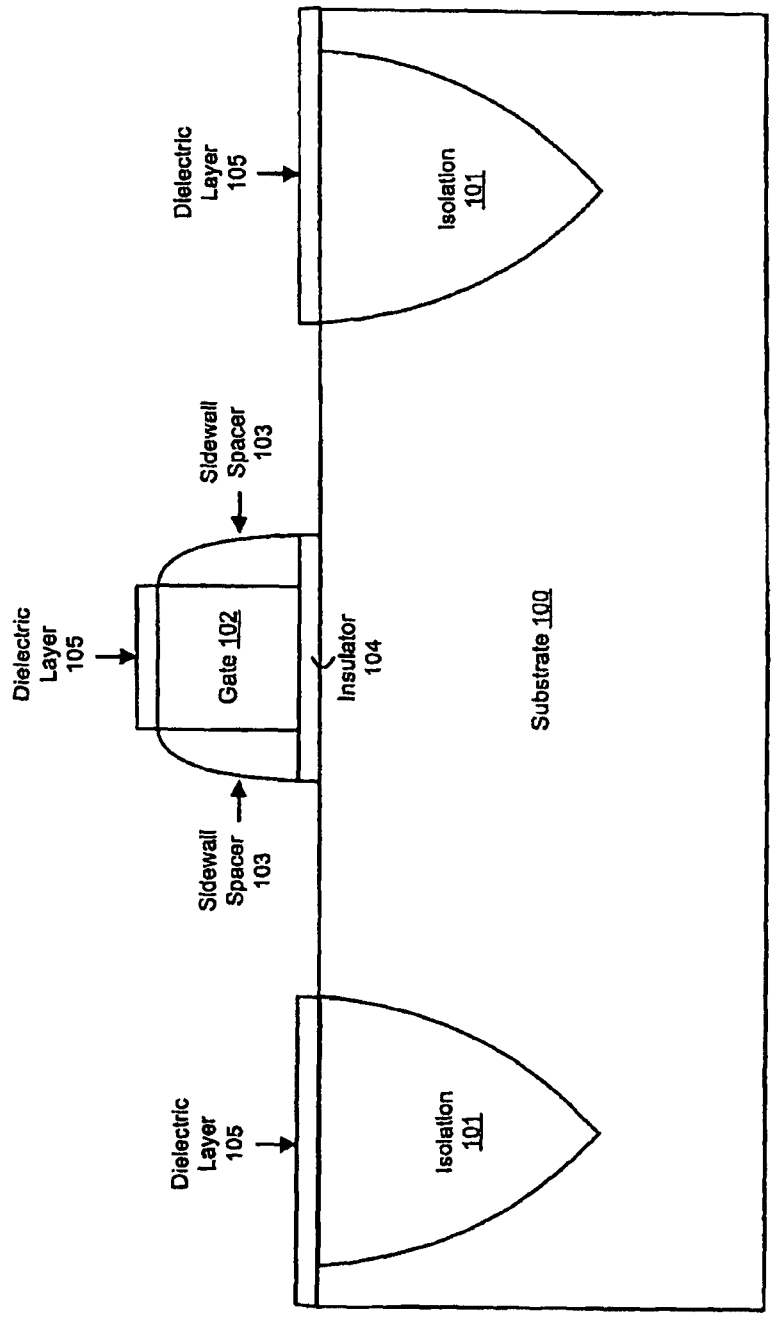
FIG. 1c: illustration of a substrate cross section following the patterning and etching of the dielectric film to expose the source and drain regions

Through the processing steps illustrated by FIG. 1a, the process as described is a standard CMOS process flow as is well known in the art. The next processing step after FIG. 1a for a CMOS flow would be to create the source and drain regions of the MOS transistor by doping the source and drain regions by ion implant. However, at this point the process of an embodiment of the invention departs from a standard CMOS process flow. In an embodiment of the invention the silicon germanium is used for the PMOS devices only. Instead of a source and drain region implant (i.e., the next step in a standard CMOS process flow), the exposed surface of the wafer is covered with a dielectric layer of, for example, $SiO_2$ or $Si_3N_4$ as illustrated by dielectric layer 104 in FIG. 1b. The dielectric layer is patterned using any known photolithographic or related patterning technique to expose the source and drain regions of the intended PMOS devices as illustrated by FIG. 1c, leaving the intended NMOS devices completely covered. An $SF_6$-based plasma etch then selectively removes the exposed silicon substrate 100 material in the source and drain regions of the PMOS device. The etch is selective in that it removes the bulk silicon substrate 100 material at a much higher rate than the $SiO_2$ or $Si_3N_4$ dielectric layer 105 and sidewall spacer 103 material serving as an etch mask. The etched source and drain regions are then selectively filled with silicon germanium (in an embodiment, in situ doped silicon germanium). The dielectric layer 105 serving as a mask for the source and drain region etch and silicon germanium deposition is then removed using, for example, an HF-based wet etch. A silicide layer is formed to provide contact to the source, drain, and gate regions of the PMOS and NMOS. The wafer can then undergo the remaining CMOS process steps to create devices that benefit from an embodiment of the invention. More specific processing techniques of an embodiment of the invention will be described in turn.

Figure 2:
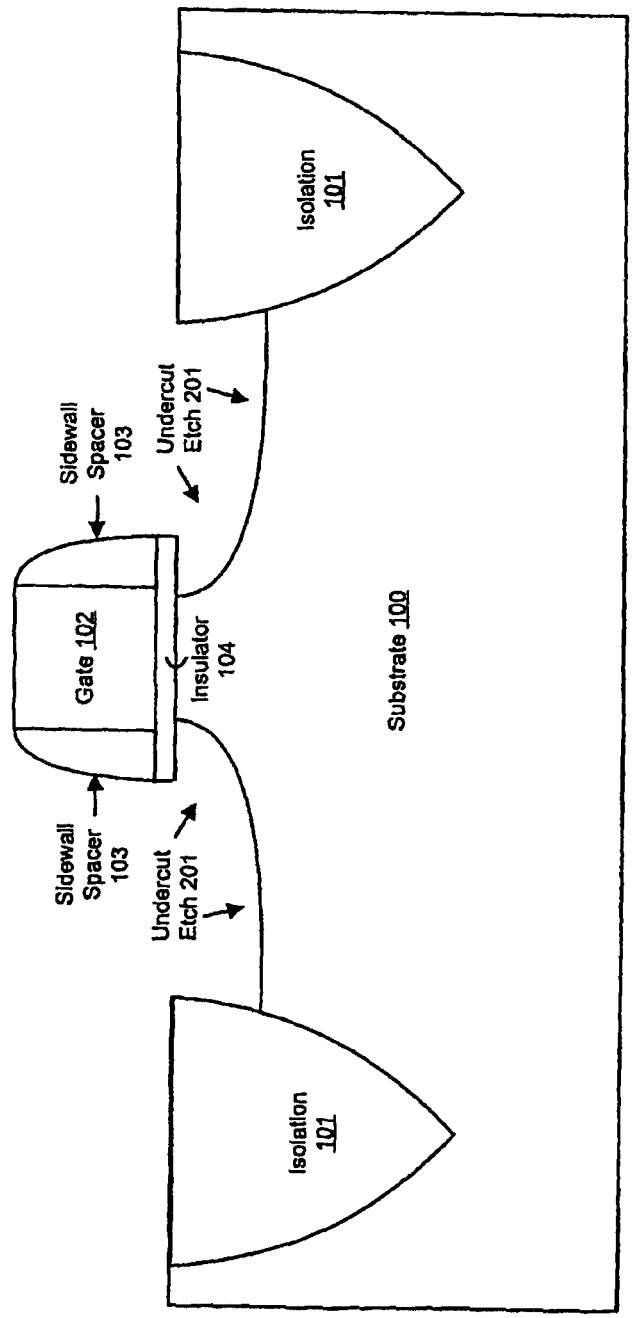
FIG. 2: illustration of a substrate cross section following the source and drain region undercut etch

FIG. 2 illustrates the substrate cross section of FIG. 1c following an undercut etch 201 to remove substrate 100 silicon from the source and drain regions of the PMOS devices as introduced above. The profile of the etch is such that substrate 100 material has been removed from beneath sidewall spacers 103. In an embodiment, the undercut etch 201 extends beneath the gate 102. The undercut aspect of the undercut etch 201 has a substantial impact on the performance benefit created by an embodiment of the invention.

Specifically, as shown in FIG. 2, the undercut etch 201 is formed in substrate 100 along laterally opposite sidewalls of gate 102. In an embodiment an isotropic etch process is used to form the undercut etch 201. An isotropic etch not only etches vertically into the substrate but also etches horizontally (laterally) beneath each sidewall spacer 103 and in an embodiment beneath gate 102. Such a lateral undercut etch can be produced by using an isotropic dry etch process in, for example, a parallel plate RF plasma etching system using a gas mix chemistry comprising $SF_6$ and helium and process conditions that favor isotropy. Such conditions include high pressure and low RF power density. In an embodiment, a process parameters include a pressure of approximately 900 mT, a gap of 1.1 cm, an RF power of 100 W, a helium flow of 150 sccm, and a $SF_6$ flow of 100 sccm is used. RF power may be varied in a range, for example, of 50 W to 200 W, and the process pressure may be varied but should be greater than approximately 500 mT. In an embodiment the undercut etch 201 has a maximum vertical depth of between 100 and 1500 angstroms below the surface of substrate 100 and extends between 25 to 200 angstrom horizontally or laterally beneath the gate 102 edge at the substrate 100/insulator 104 interface. It is to be appreciated that alternative process conditions and etch chemistries (e.g., a wet etch) can be utilized to generate other undercut etch 201 geometry profiles is desired.

Not only does such an etching process produce lateral undercuts beneath each sidewall spacer 103 and in an embodiment beneath the gate 102 but the etch chemistry is also highly selective to the insulator 104 oxide and to the sidewall spacer 103 nitride material. In this way the undercut etch does not attack the insulator and sidewall spacer 103 material and the geometry of each is preserved.

The etch chemistry used to form the undercut etch 201 is further slightly oxidizing. Utilizing an oxidizing etchant causes a portion of the insulator 104 layer exposed during the undercut etch process to become thicker than the unexposed portion of the insulator 104 layer. By increasing the thickness of the insulator 104 layer at the edge of the gate 102, the gate edge leakage at the tip overlap region of the device is reduced. A thicker insulator 104 layer at the gate 102 edge helps to increase the breakdown voltage of the device.

A further advantage of the undercut etch 201 process is that the etch rate reduced to between 5 to 30 angstroms per second, causing the etch of the silicon substrate to concave inwards. With this geometry, a large $L_{MET}$ (metallurgical channel length or physical channel length) is achieved during the off state of the MOS transistor (low $I_{off}$) while a smaller $L_{MET}$ is realized during the on state of the MOS transistor when the channel is formed. A smaller $L_{MET}$ during the on state directly translates to a smaller channel resistance and accordingly higher Ion.

Figure 3:
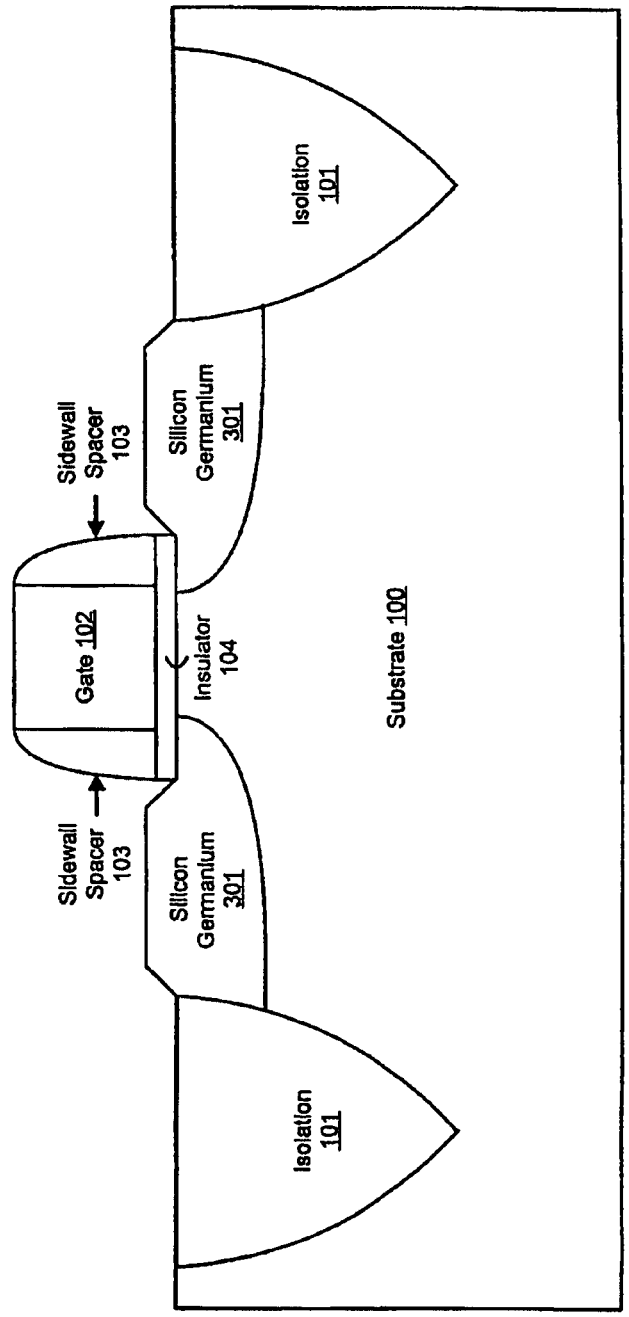
FIG. 3: illustration of a substrate cross section following the deposition of silicon germanium in the undercut etched source and drain regions

FIG. 3 illustrates the substrate cross section of FIG. 2 following the deposition of silicon germanium 301 in the undercut etch 201 source and drain regions. The silicon germanium, as noted, can be represented by $Si_{1-x}Ge_x$. The domain of x is [0,1] ranging from pure silicon to pure germanium, and can be adjusted to tune the conductivity and band gap to the requirements of a particular device. In an embodiment, x is approximately between 0.05 and 0.5 (e.g., approximately between 5% and 50% atomically germanium in the silicon germanium alloy). In another embodiment, x is approximately between 0.1 and 0.4 (e.g., approximately between 10% and 40% atomically germanium in the silicon germanium alloy). In yet another embodiment x is approximately between 0.15 and 0.3 (e.g., approximately between 15% and 30% atomically germanium in the silicon germanium alloy). The band gap energy associated with the silicon germanium 301 alloy can be approximated by the following equations:

$$E_g(x)=(1.155-0.43x+0.0206x^2)eV \text{ for } 0<x<0.85 \quad (1)$$

$$E_g(x)=(2.010-1.27x)eV \text{ for } 0.85<x<1 \quad (2)$$

In an embodiment, therefore, according to equation (1) the band gap energy of the silicon germanium 301 is approximately between 1.13 eV and 095 eV for 5% atomically germanium and 50% atomically germanium respectively. In another embodiment, the band gap energy of the silicon germanium 301 is approximately between 1.11 eV and 0.99 eV for 10% atomically germanium and 40% atomically germanium respectively. In yet another embodiment the band gap energy of the silicon germanium 301 is approximately between 1.09 eV and 1.03 eV for 15% atomically germanium and 30% atomically germanium respectively.

The silicon germanium 301 is deposited by selective epitaxial deposition in that the silicon germanium is deposited only on the bulk silicon substrate surface exposed by the undercut etch 201 and uncovered by the dielectric layer 105. The silicon germanium 301 crystal does not grow on the $SiO_2$ or $Si_3N_4$ dielectric layer. In an embodiment, the deposition technique is reduced pressure chemical vapor deposition ("CVD") epitaxial deposition. In other embodiments, the deposition technique includes atmospheric CVD epitaxy and ultra high vacuum CVD epitaxy. Each deposition technique is a specific form of vapor phase epitaxy as the deposited silicon germanium 301 is single crystal.

As noted, in an embodiment, the silicon germanium deposition method is CVD epitaxy. Environmentally, the epitaxy occurs between 600° C. and 800° C. at a pressure between 10 and 760 torr. Either $H_2$ or He can be used as a carrier gas. The silicon source precursor gas can be $SiH_2Cl$, $SiH_4$, or $Si_2H_6$. In an embodiment, $GeH_4$ is the germanium source precursor gas. HCl or $Cl_2$ may be added as an etching agent to increase the material selectivity of the deposition. In an embodiment, the resulting silicon germanium 301 deposited in the undercut etch 201 source and drain regions has a thickness between 500 and 2000 angstroms. In an embodiment, the silicon germanium 301 deposition extends above the surface of substrate 100. In this way the silicon germanium 301 is formed both above and below the surface of substrate 100. By forming silicon germanium 301 above the surface of substrate 100, a raised tip is formed, increasing the conductivity of the tip. The increased conductivity in turn improves device performance.

The silicon germanium 301 can further be doped to adjust its electrical and chemical properties. The doping can occur using a variety of dopants and with a variety of doping techniques. For example, the silicon germanium 301 can be in situ doped with p-type impurities to a dopant concentration level between $1*10^{18}/cm^3$ and $3*10^{21}/cm^3$ with a concentration of approximately $1*10^{20}$ $cm^3$ being preferred. In an embodiment, and creating a PMOS device, the silicon germanium 301 is doped with boron in situ during epitaxy by utilizing the precursors noted above and an additional $B_2H_6$ precursor gas as the source of the boron dopant during the silicon germanium 301 epitaxial deposition. The benefit of doping silicon germanium 301 in situ is that the undercut nature of undercut etch 201 makes it very difficult to dope the silicon germanium 301 after it has been deposited in area shadowed by the sidewall spacer. An angled implant, as one possible solution to doping the silicon germanium shadowed by the sidewall spacer, reduces the short channel performance of the resulting PMOS device.

In an embodiment, a fraction of the boron dopant added during the silicon germanium 301 deposition is not activated at this time. That is, after deposition boron atoms are in the silicon germanium 301 layer but have not yet substituted into silicon sites in the lattice where they can provide a hole (i.e., a lack of an electron). In an embodiment, the thermal activation of the dopant is deferred until subsequent processing steps, reducing the thermal budget and resulting dopant diffusion to enable a very abrupt source/drain junction to be formed, improving device performance.

As introduced, the deposited silicon germanium 301 has a larger lattice constant, the magnitude of which depends on the atomic percent germanium in the silicon germanium 301 alloy. When deposited on the substrate 100 silicon, the lattice of the silicon germanium 301 is compresses to accommodate crystalline growth. The compression in the silicon germanium 301 source and drain regions further creates compression in the substrate 100 region located between the silicon germanium 301 source and drain regions and beneath the insulator 104 region (i.e., the channel of the MOS device). The compression creates an anisotropic atomic structure in the channel region, altering the conduction and valence bands of the channel material. The compressive stress further reduces the hole effective mass in the channel area of substrate 100, in turn increasing hole mobility. The increased hole mobility increases the saturation channel current of the resulting MOS transistor, thereby improving the device performance.

Figure 4A:
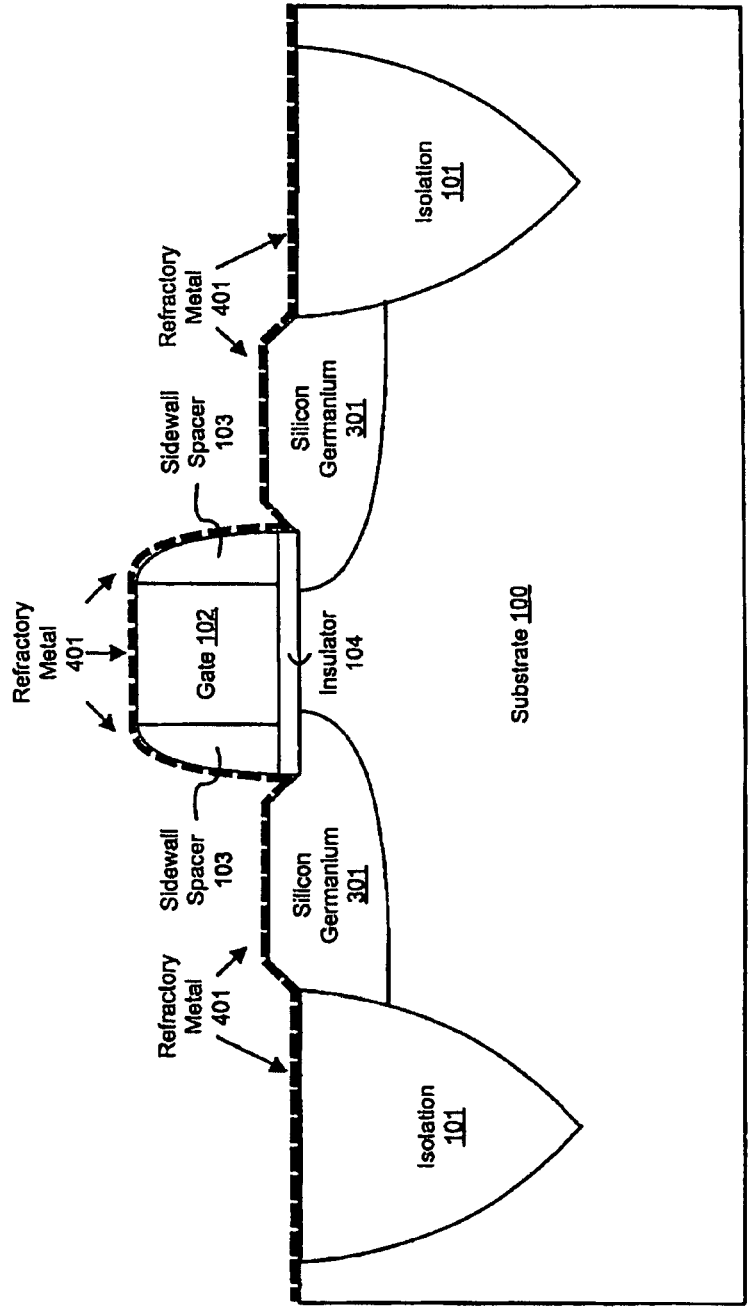
FIG. 4a: illustration of a substrate cross section following the deposition of a refractory metal
Figure 4B:
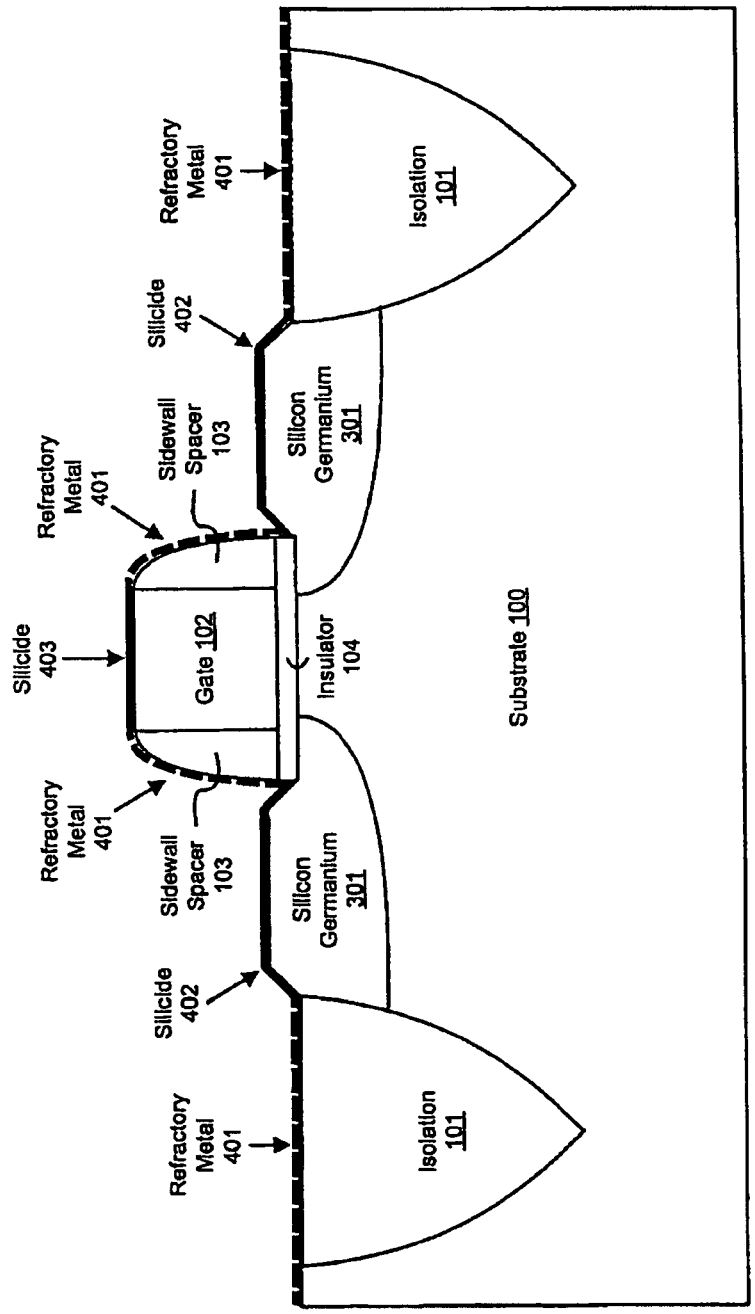
FIG. 4b: illustration of a substrate cross section following a formation anneal to form a silicide contact layer on the surface of the silicon germanium source drain regions and gate region
Figure 4C:
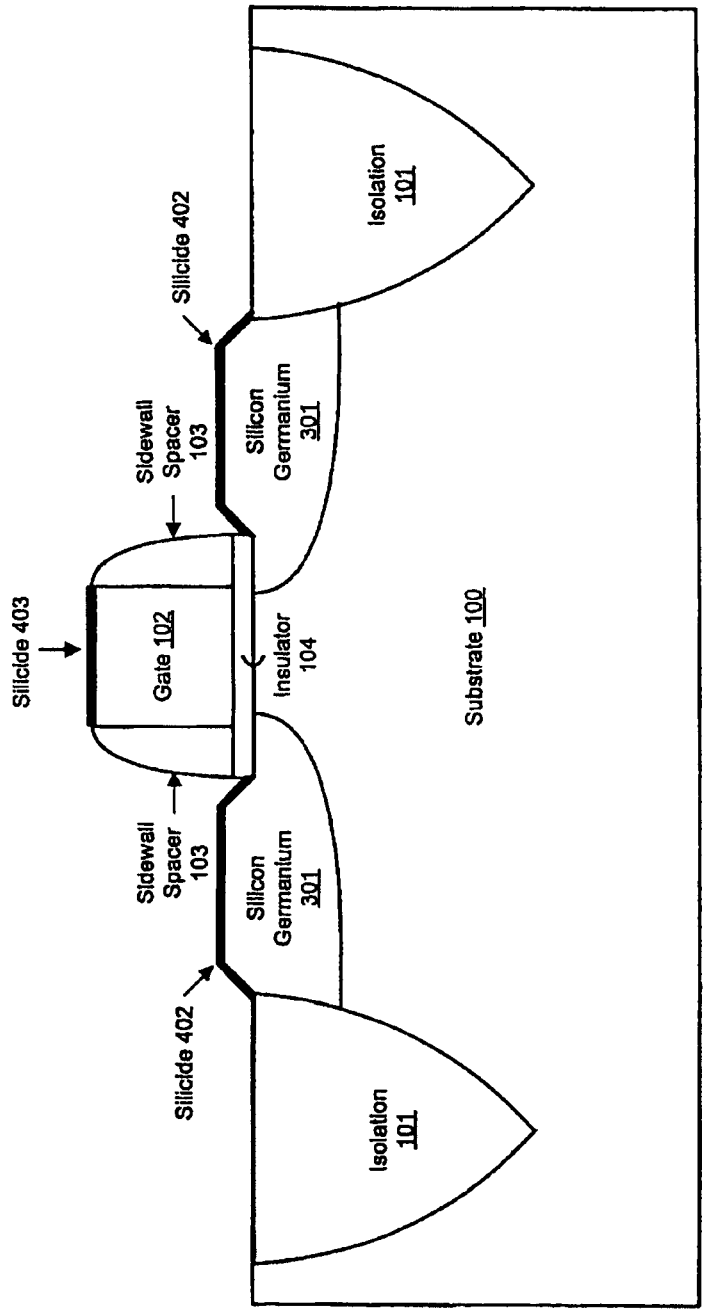
FIG. 4c: illustration of a substrate cross section following the removal of unreacted refractory metal

FIGS. 4a, 4b, and 4c illustrate the substrate cross section of FIG. 3 during the creation of a silicide layer. More specifically, the layer is a self-aligned silicide or salicide layer. One skilled in the art will recognize that silicide layer 402 is formed by depositing a thin layer of refractory metal, in an embodiment with standard sputtering techniques (i.e., physical vapor deposition or "PVD"), on the silicon germanium 301 followed by subsequent processing steps to create the metal, silicon, and germanium silicide alloy. Silicide 403 differs in that the semiconductor element of the silicide alloy depends on the material composition of gate 102.

Refractory metals include, among others, cobalt, titanium and nickel. In an embodiment, the refractory metal is nickel. The selection of a refractory metal requires consideration of not only electrical compatibility, but also mechanical and chemical compatibility with the underlying silicon germanium 301 material occupying the undercut etch 201 source and drain regions and the exposed source, drain, and gate regions of the corresponding NMOS devices on the same substrate. For example, the silicide layer 402 must be continuous and uniform to aid reducing interface resistance between the silicide layer 402 and the underlying silicon germanium 301. Nickel tends to react uniformly with both silicon and germanium, forming a stable ternary Ni(SiGe) phase whereas cobalt and titanium react preferentially with silicon and segregate the germanium component of the silicon germanium 301 alloy. Further, the titanium and cobalt based silicon germanium silicides have reduced thermal stability compared to nickel silicon germanium silicide. Improper refractory metal selection creates a non-ideal interface between the silicide and semiconductor that increases the interface resistance independent of otherwise electrically compatible materials.

FIG. 4a illustrates the substrate of FIG. 3 following the blanket deposition of refractory metal 401. As noted, in an embodiment the refractory metal is PVD nickel. Environmentally, the PVD nickel deposition occurs between 20° C. and 200° C. and at a pressure less than 50 millitorr. The thickness of the nickel is between 50 and 200 angstroms. The nickel deposition is followed by a rapid formation anneal at between 325° C. and 450° C. for less than or equal to 60 seconds using, for example, rapid thermal anneal ("RTA") equipment. During the formation anneal the refractory metal 401 atop the silicon germanium 301 and gate 102 reacts to form silicide 402 and silicide 403 respectively as illustrated by FIG. 4b. As the nickel is deposited over the entire exposed surface of the substrate 100, the unreacted nickel (i.e., the nickel that has not reacted with silicon or silicon germanium to form a silicide with its underlying layer as it is deposited atop the sidewall spacer 103 nitride or the isolation 101 regions) is removed using a wet etch chemistry of, for example, a mixture of hot $H_2O_2$ and hot $H_2SO_4$. The remaining reacted nickel atop the silicon germanium 301 source and drain regions and the gate 102 regions then undergoes a final anneal between 400° C. and 550° C. to complete the nickel silicon germanium silicide 402 and silicide 403 formation as illustrated by FIG. 4c. The silicide layer(s) may be further capped with, for example, a titanium nitride cap to prevent the nickel silicon germanium silicide layer 402 and silicide layer 403 from oxidizing during subsequent processing steps as is well known in the art.

Figure 5:
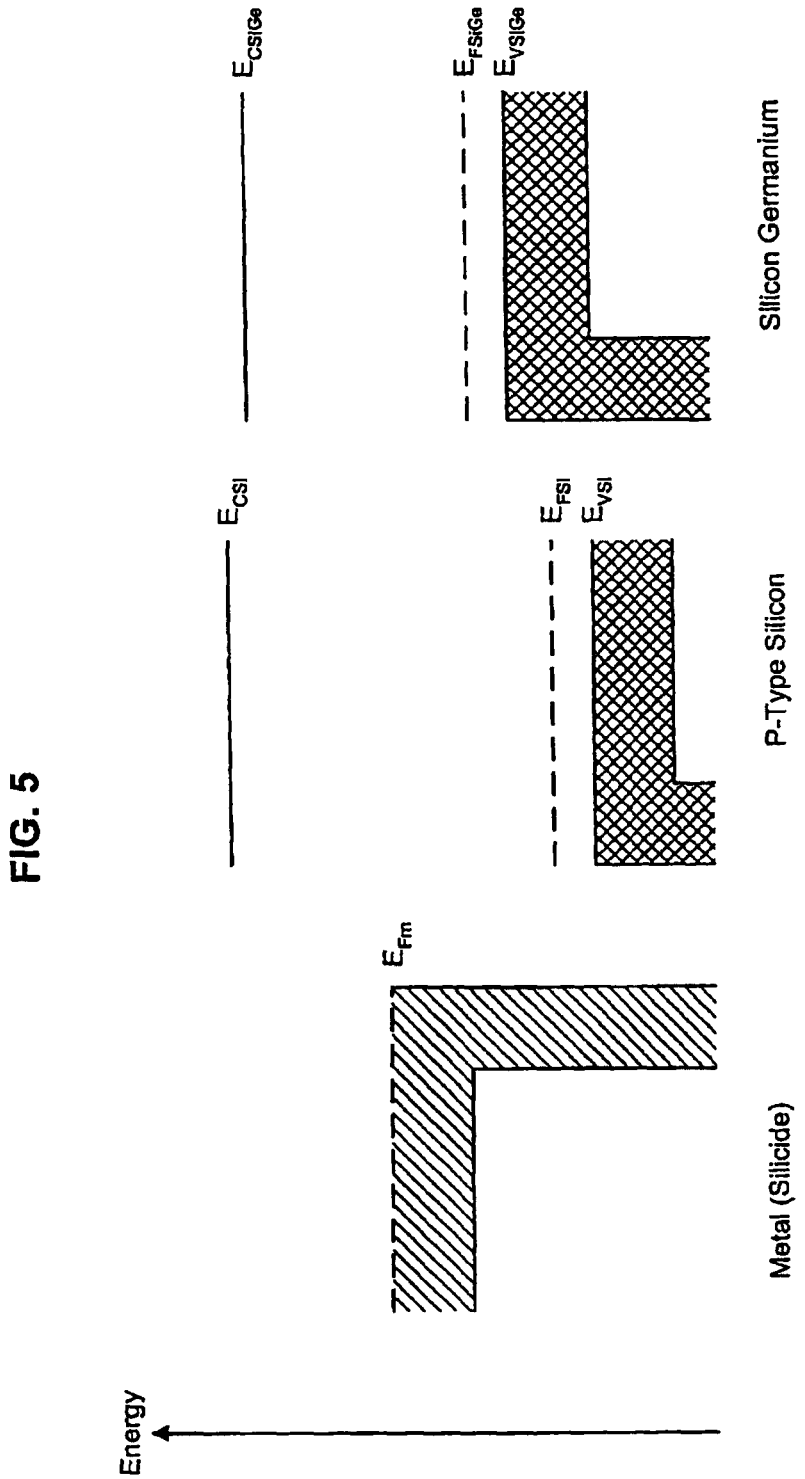
FIG. 5: illustration of the band structure of p-type silicon versus silicon germanium
Figure 6:
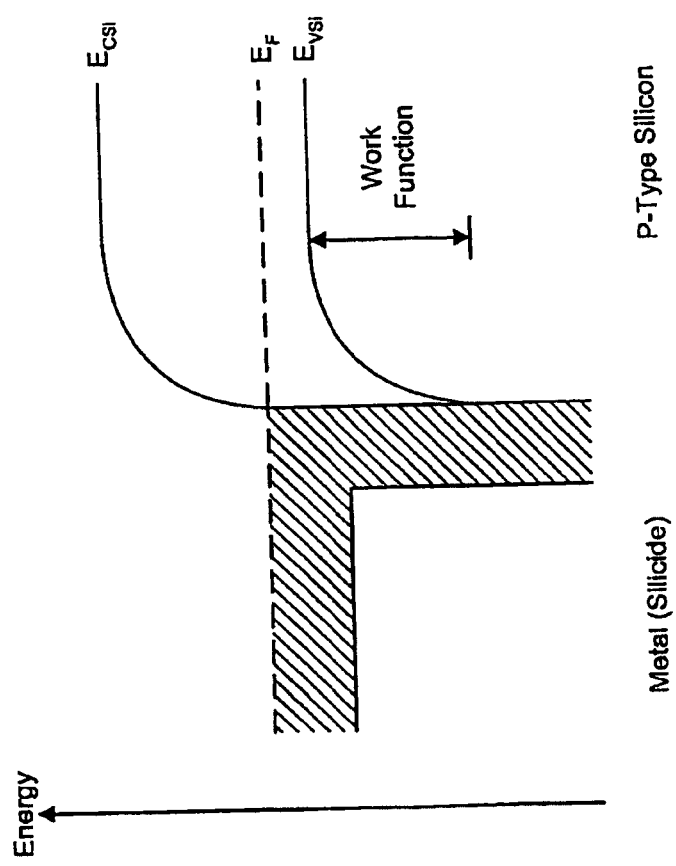
FIG. 6: illustration of the band structure of p-type silicon in contact with a metal
Figure 7:
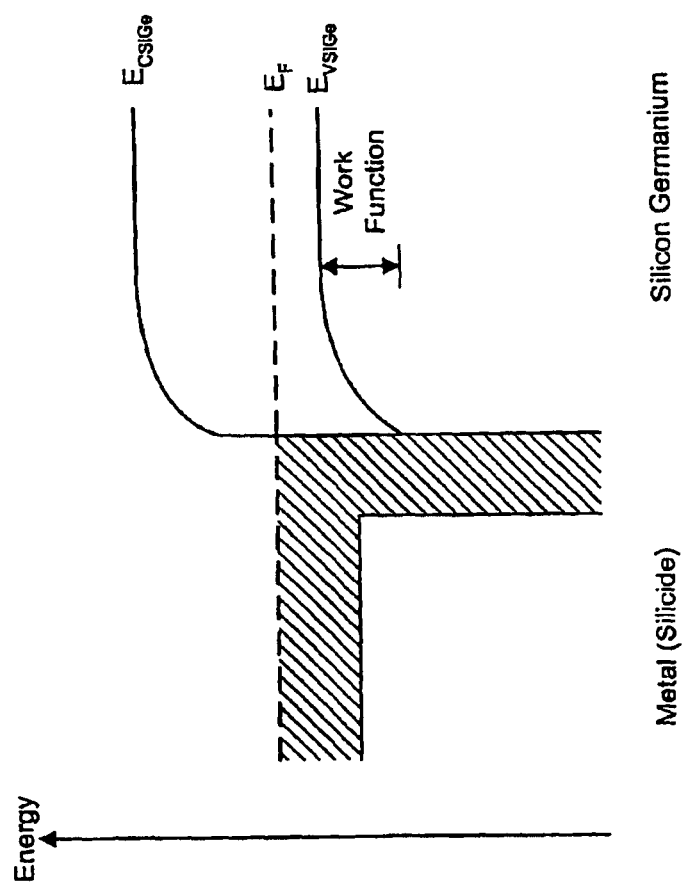
FIG. 7: illustration of the band structure of silicon germanium in contact with a metal

FIGS. 5 through 7 illustrate the physics of how the proper material selection for both the refractory metal and the source-drain region material reduce the corresponding contact resistivity. FIG. 5 illustrates energy band diagrams for the bulk metal, p-type silicon, and silicon germanium. The Fermi energy of the metal is denoted $E_{Fm}$. The Fermi energies of the p-type silicon and silicon germanium are $E_{FSi}$ and $E_{FSiGe}$ respectively. As shown, though not necessarily to scale, the conduction band edge of the silicon germanium $E_{CSiGE}$ is slightly lower than the conduction band edge of silicon $E_{CSi}$. Further, the valence band edge of the silicon germanium $E_{VSiGe}$ is higher than the valence band edge of the silicon $E_{VSi}$, and is proportionately higher based on the percentage composition of germanium in the silicon germanium alloy. Accordingly, the energy band gap of the silicon germanium alloy is smaller than the energy band gap of silicon, the extent to which is, as introduced with reference to equations (1) and (2), dependant upon the percentage composition of germanium in the germanium alloy.

FIG. 6 illustrates the band bending associated with contact between the refractory metal and the p-type silicon. Of note is the magnitude of the energy barrier. With the p-type semiconductor, aligning the Fermi levels at equilibrium mandates a positive charge on the metal side and a negative charge on the semiconductor side. The semiconductor accommodates the negative charge by generating a depletion region in which ionized acceptors are left uncompensated by holes.

FIG. 7 illustrates the energy band bending associated with contact between the refractory metal and the silicon germanium 301 alloy. Again of note is the magnitude of the energy barrier, in this case the relative difference in energy barrier height of the silicon germanium alloy when compared to p-type silicon. In other words, the metal-semiconductor work function is smaller for the metal-silicon germanium 301 contact versus the metal-p-type silicon contact. Current conduction for the contact is dominated by tunneling. The specific contact resistivity relationship is as follows:

$$\rho_c \propto e^{\frac{4\pi\Phi_B}{qh}\sqrt{\frac{m^*\varepsilon}{N_{surf}}}} \quad (3)$$

The salient variables in equation (3) are the metal-semiconductor work function $\Phi_B$, the semiconductor doping $N_{surf}$, and the effective carrier mass in the semiconductor m*. As noted, the effective mass for holes in a silicon germanium film is $0.34\, m_0$ versus $0.37\, m_0$ for silicon, where $m_0$ represents the rest mass of the electron.

The specific contact resistivity equation (3) illustrates that the specific contact resistivity for a metal-semiconductor interface depends primarily on the metal-semiconductor work function, the doping density in the semiconductor, and the effective mass of the carrier. Altering any one of the variables, or combinations thereof, impacts the specific contact resistivity. Utilizing silicon germanium 301, as noted, decreases the metal semiconductor work function and decreases the carrier effective mass. In an embodiment, the silicon germanium is further doped as noted with reference to FIG. 3.

The interface between the silicon germanium 301 and the silicide 402 can be further discussed as a metal-semiconductor ohmic contact. To begin, the effect of the energy barrier at the contact between the silicide and the semiconductor must be viewed from a quantum mechanical view. As is well know in the art, the wave-particle duality dictates that an electron be treated as both a particle and a wave to determine how it behaves. The energy barrier created by the silicide-semiconductor interface can be viewed potential barrier of finite thickness and height. For a given barrier height greater than the energy of an incident electron and a given barrier width, there is a certain probability that the electron will penetrate the barrier and appear on the other side. Such a tunneling phenomena is an important mechanism in the conduction of electrons in solids.

More specifically, contact resistivity is a measure of how easily current can flow across a metal-semiconductor interface. If a contact is ohmic, by definition there is an unimpeded transfer of majority carriers from one material to another—in this case between the silicide 402 and the silicon germanium 301. This can also be represented as a linear current-voltage characteristic. In the case of a metal-semiconductor interface, the conduction mechanism is dictated in part by the width of the semiconductor depletion region adjacent to the contact interface. If the semiconductor is lightly doped (e.g., the Fermi energy is neither close to the conduction band edge energy or the valence band edge energy), the depletion region becomes wide enough that the only way for an electron to transfer between the two contact materials is by jumping the potential barrier by thermionic emission over the barrier maximum. Alternatively, if the semiconductor is heavily doped (the Fermi energy approaching the conduction band edge energy for n-type and approaching the valence band edge energy for p-type) the depletion region becomes sufficiently narrow that the field emission, or carrier tunneling, is the dominant conduction mechanism. Both field emission and thermionic emission contribute to conduction across the interface and can be engineered by, for example, material selection and doping.

FIG. 8 illustrates an embodiment of the invention utilizing silicon germanium 301 source and drain regions with, for example, a nickel silicon germanium silicide layer 402. An external resistance $R_{ext}$ 801 is the total series resistance between the source (or drain) contact and the channel of the intrinsic transistor. The interface resistance between the silicon germanium 301 and silicide 402 is a significant component of the total series resistance. $R_{ext}$ 801 has been reduced by using silicon germanium versus using p-type silicon for the source and drain regions. Further, proper selection of the silicide layer 402 refractory metal, in an embodiment nickel, has ensured a chemically and mechanically compatible metal-semiconductor interface that does not adversely contribute to $R_{ext}$ 801 as noted with reference to FIG. 4.

One skilled in the art will recognize the elegance of the disclosed embodiment in that it decreases the specific contact resistivity between the silicon germanium source and drain regions and their respective silicide contacts by utilizing novel material selection and processing techniques. As the contact resistivity contributes to the overall external resistivity of the transistor, a reduction in the contact resistivity contributes to an overall performance increase in the transistor.

What is claimed is:

1. A method comprising:
    forming an insulator region on a substrate having a first lattice constant;
    etching a source region and a drain region in the substrate, thereby defining a channel region located between the source region and the drain region, and beneath the insulator region;
    depositing a semiconductor material in the source region and in the drain region, the semiconductor material having a second lattice constant larger than the first lattice constant;
    wherein the semiconductor material in the source region and in the drain region creates compression in the channel region; and
    forming contacts on the top surface of the semiconductor material in the source region and in the drain region;
    wherein the contacts comprise an alloy of nickel and the semiconductor material.

2. The method of claim 1 wherein the semiconductor material is a silicon germanium alloy.

3. The method of claim 2 wherein the contacts comprise nickel silicon germanium silicide.

4. The method of claim 2 wherein the silicon germanium alloy has a germanium composition between 5% and 50%.

5. The method of claim 4 wherein the silicon germanium alloy has a germanium composition between 10% and 40%.

6. The method of claim 5 wherein the silicon germanium alloy has a germanium composition between 15% and 30%.

* * * * *